(12) United States Patent
Lee et al.

(10) Patent No.: US 9,117,697 B2
(45) Date of Patent: Aug. 25, 2015

(54) SEMICONDUCTOR SUBSTRATE AND METHOD FOR MAKING THE SAME

(71) Applicant: Advanced Semiconductor Engineering, Inc., Kaohsiung (TW)

(72) Inventors: Chun-Che Lee, Kaohsiung (TW); Yuan-Chang Su, Kaohsiung (TW); Wen-Chi Cheng, Kaohsiung (TW); Guo-Cheng Liao, Kaohsiung (TW); Yi-Chuan Ding, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 14/303,371

(22) Filed: Jun. 12, 2014

(65) Prior Publication Data

US 2014/0367837 A1 Dec. 18, 2014

(30) Foreign Application Priority Data

Jun. 13, 2013 (CN) .......................... 2013 1 0233893

(51) Int. Cl.
*H01L 23/52* (2006.01)
*H01L 21/44* (2006.01)
*H01L 23/00* (2006.01)

(52) U.S. Cl.
CPC ................ *H01L 24/11* (2013.01); *H01L 24/14* (2013.01); *H01L 2224/11019* (2013.01); *H01L 2224/1163* (2013.01); *H01L 2224/11622* (2013.01); *H01L 2224/14104* (2013.01)

(58) Field of Classification Search
CPC .................... H01L 24/11; H01L 24/14; H01L 2224/14104; H01L 2224/1163
USPC .......................................... 257/774; 438/667
See application file for complete search history.

(56) References Cited

U.S. PATENT DOCUMENTS

| | | | | |
|---|---|---|---|---|
| 6,861,757 | B2 * | 3/2005 | Shimoto et al. ................ | 257/773 |
| 7,902,660 | B1 * | 3/2011 | Lee et al. ........................ | 257/698 |
| 7,932,170 | B1 * | 4/2011 | Huemoeller et al. .......... | 438/613 |
| 8,039,756 | B2 * | 10/2011 | Kikuchi et al. ................ | 174/260 |
| 8,169,071 | B2 * | 5/2012 | Jang et al. ...................... | 257/698 |

* cited by examiner

*Primary Examiner* — Luan C Thai
(74) *Attorney, Agent, or Firm* — Foley & Lardner LLP; Cliff Z. Liu; Angela D. Murch

(57) ABSTRACT

The present disclosure relates to a semiconductor substrate and a method for making the same. The semiconductor substrate includes an insulation layer, a first circuit layer, a second circuit layer, a plurality of conductive vias and a plurality of bumps. The first circuit layer is embedded in a first surface of the insulation layer, and exposed from the first surface of the insulation layer. The second circuit layer is located on a second surface of the insulation layer and electrically connected to the first circuit layer through the conductive vias. The bumps are directly located on part of the first circuit layer, where the lattice of the bumps is the same as that of the first circuit layer.

20 Claims, 10 Drawing Sheets

SEMICONDUCTOR SUBSTRATE AND METHOD FOR MAKING THE SAME

CROSS REFERENCE TO RELATED APPLICATIONS

This application claims the benefit of Chinese Patent Application No. 201310233893.X, filed 13 Jun. 2013, the contents of which are incorporated herein by reference in their entireties.

BACKGROUND

1. Technical Field

The present disclosure relates to a substrate and a manufacturing method thereof, and more particularly to a semiconductor substrate and a manufacturing method thereof.

2. Description of the Related Art

In a conventional semiconductor substrate, the outermost circuit layer is embedded in a surface of an insulation layer of the substrate, and exposed from the surface of the insulation layer. As an exposed surface of the circuit layer may be coplanar with the surface of the insulation layer, during bonding to a flip chip, if warpage occurs on the circuit substrate, part of bumps (for example, solder balls) of the flip chip may not contact the circuit layer, causing an open circuit, resulting in product failure.

A solution is forming bumps (for example, copper pillars) on the exposed surface of the circuit layer, and then bonding to the flip chip. However, bumps formed in the existing manners have a problem of offset, that is, the bumps cannot be located right on the pads of the circuit layer, but may cover part of the surface of the insulation layer. Such situation is unallowable when the distance between circuits is closer and denser, because it easily results in that the bumps of the flip chip simultaneously contact the offset bump and adjacent pad or trace thereof, to cause a bridge, resulting in produce failure.

SUMMARY

One aspect of the present disclosure relates to a manufacturing method of a semiconductor substrate. In an embodiment, the manufacturing method includes the following: providing an embedded circuit substrate, the embedded circuit substrate including an insulation layer, a first circuit layer and a plurality of conductive vias, wherein the insulation layer has a first surface and a second surface, the first circuit layer is embedded in the first surface of the insulation layer, and exposed from the first surface of the insulation layer, and the conductive vias penetrate through the insulation layer and contact the first circuit layer; forming a photoresist layer on the first circuit layer, wherein the photoresist layer has a plurality of openings, and the openings expose part of the first circuit layer; and forming a plurality of bumps on the exposed first circuit layer.

In this embodiment, the bumps are formed on the exposed first circuit layer. Therefore, the bumps are completely located right on the pads. When the semiconductor substrate is bonded to a flip chip, bumps of the flip chip may directly contact the bumps of the semiconductor substrate, and does not easily result in the situation that the bumps contact pad or trace adjacent to the bumps to cause bridge. Especially when the first circuit layer is fine pitch, the bridge situation is still not easy to occur, and the yield of products can be maintained.

Another aspect of the present disclosure relates to a semiconductor substrate. In an embodiment, the semiconductor substrate includes an insulation layer, a first circuit layer, a second circuit layer, a plurality of conductive vias and a plurality of bumps. The insulation layer has a first surface and a second surface. The first circuit layer is embedded in the first surface of the insulation layer, and exposed from the first surface of the insulation layer. The second circuit layer is located on the second surface of the insulation layer. The conductive vias penetrate through the insulation layer and are electrically connected to the first circuit layer and the second circuit layer. The bumps are directly located on part of the first circuit layer, where the lattice of the bumps is the same as that of the first circuit layer.

DETAILED DESCRIPTION

Figure 1:
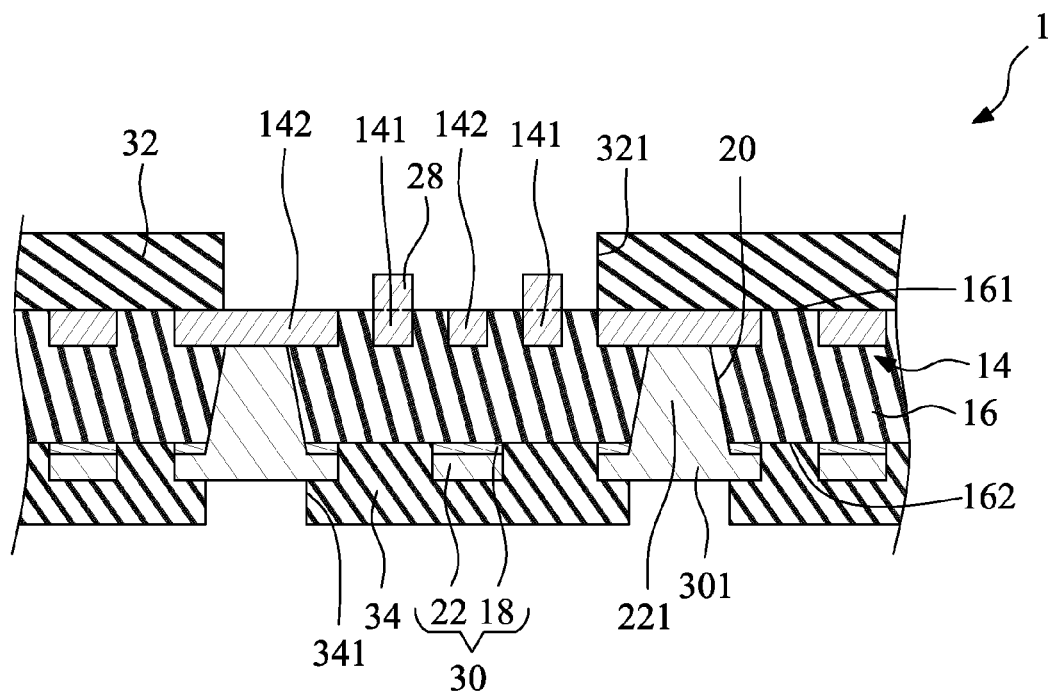
FIG. 1 is a schematic partial cross-sectional view of an embodiment of a semiconductor substrate according to the present disclosure.

FIG. 1 is a schematic partial cross-sectional view of an embodiment of a semiconductor substrate according to the present disclosure. The semiconductor substrate 1 includes an insulation layer 16, a first circuit layer 14, a second circuit layer 30, a plurality of conductive vias 221, a plurality of bumps 28, a first protection layer 32 and a second protection layer 34.

The insulation layer 16 is made from an insulating material or a dielectric material, for example, Polypropylene (PP), which has a first surface 161, a second surface 162 and a plurality of through holes 20. The first circuit layer 14 is embedded in the first surface 161 of the insulation layer 16, and exposed from the first surface 161 of the insulation layer 16. An exposed surface of the first circuit layer 14 is substantially coplanar with the first surface 161 of the insulation layer 16. In this embodiment, the first circuit layer 14 is a patterned conductive circuit layer, including a plurality of pads 141 and a plurality of traces 142. The first circuit layer 14 is made, for example, from electroplated copper, which is formed by an electroplating process.

The second circuit layer 30 is located on the second surface 162 of the insulation layer 16. In this embodiment, the second circuit layer 30 is not embedded in the second surface 162 of the insulation layer 16. In this embodiment, the second circuit layer 30 is a patterned conductive circuit layer, which includes, or consists of, a second metal layer 18 and a third metal layer 22. The second metal layer 18 is located on the second surface 162 of the insulation layer 16, and the third metal layer 22 is located on the second metal layer 18. The second metal layer 18 is formed by etching a copper foil, for example, and the third metal layer 22 is, for example, electroplated copper, formed by an electroplating process. The second circuit layer 30 includes a plurality of solder ball pads 301.

The conductive vias 221 are located in the through holes 20, and thus penetrate through the insulation layer 16 and are electrically connected to the first circuit layer 14 and the second circuit layer 30. In this embodiment, the through holes 20 further penetrate through the second metal layer 18; the conductive vias 221 may be formed at the same time as the third metal layer 22.

The bumps 28 (for example, copper pillars) are directly located on part of the first circuit layer 14, wherein the lattice of the bumps 28 is the same as that of the first circuit layer 14. In this embodiment, the bumps 28 are made from electroplated copper, which is directly formed on the pads 141 of the first circuit layer 14 in a manner of electroplating. Therefore, it can be seen by using a focused ion beam (FIB) that, an interface between the bumps 28 and the pads 141 of the first circuit layer 14 is not noticeable, and the bumps 28 and the first circuit layer 14 have the same lattice. In this embodiment, each of the bumps 28 is located in a range enclosed by an extending upward imaginary plane of an outer sidewall of each of the pads 141. That is, the bumps 28 are located right on the pads 141, and the range enclosed by an outer wall of the bump 28 is equal to or slightly less than that enclosed by the outer wall of the pad 141. Because the bumps 28 are formed by extending from the pads 141, the bumps 28 and the pads 141 do not have the problem of offset therebetween, and the bumps 28 may not cover or contact the first surface 161 of the insulation layer 16.

The first protection layer 32 is located on the first surface 161 of the insulation layer 16 and the first circuit layer 14, and has at least one opening 321, so as to expose part of the first surface 161 of the insulation layer 16, part of the first circuit layer 14 and the bumps 28. In this embodiment, the first protection layer 32 is made, for example, from solder mask, such as Benzocyclobutene (BCB) or Polyimide (PI).

The second protection layer 34 is located on the second surface 162 of the insulation layer 16 and the second circuit layer 30, and has at least one opening 341, so as to expose part of the second circuit layer 30 (that is, the solder ball pads 301), for the solder balls to connect. In this embodiment, the second protection layer 34 is made, for example, from solder mask, such as BCB or PI.

In this embodiment, the bumps 28 are located right on the pads 141, and thus when the semiconductor substrate 1 is bonded to a flip chip (not shown), bumps of the flip chip may directly contact the bumps 28 of the semiconductor substrate 1, which may not easily result in the situation that the bumps contact pads or traces adjacent to the bumps 28 to cause bridge. Especially when the first circuit layer 14 is fine pitch, the bridge situation is still not easy to occur, and the yield of products can be maintained.

Figure 2:
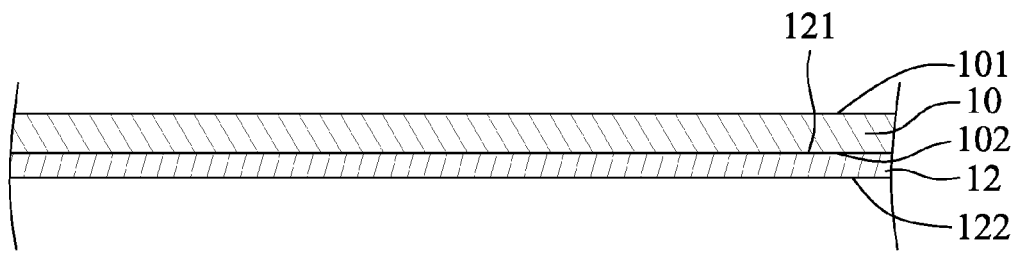
FIG. 2, FIG. 3, FIG. 4, FIG. 5, FIG. 6, FIG. 7, FIG. 8, FIG. 9, FIG. 10 and FIG. 11 are schematic views of an embodiment of a manufacturing method of a semiconductor substrate according to the present disclosure.

FIG. 2 to FIG. 11 are schematic views of an embodiment of a manufacturing method of a semiconductor substrate according to the present disclosure. Referring to FIG. 2, a carrier 10 is provided, and the carrier 10 has a first surface 101 and a second surface 102. Next, a first metal layer 12 is formed on the second surface 102 of the carrier 10. In this embodiment, the first metal layer 12 is a copper foil, which has a first surface 121 and a second surface 122. The first surface 121 of the first metal layer 12 is pressed on or adhered to the second surface 102 of the carrier 10.

Figure 3:
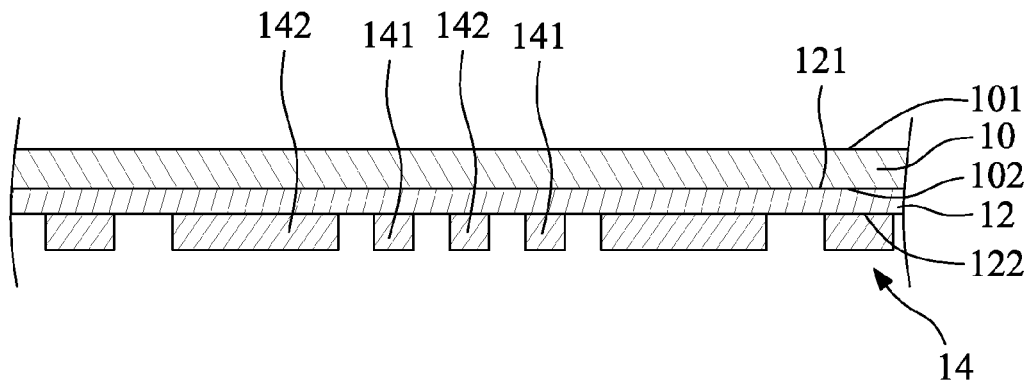

Referring to FIG. 3, the first circuit layer 14 is formed on the first metal layer 12. In this embodiment, the first circuit layer 14 may be made from electroplated copper, which is formed on the second surface 122 of the first metal layer 12 by an electroplating process. The first circuit layer 14 is a patterned conductive circuit layer, including a plurality of pads 141 and a plurality of traces 142. In this embodiment, distance between the pad 141 and adjacent pad 141 or trace 142 is less than 25 μm.

Figure 4:
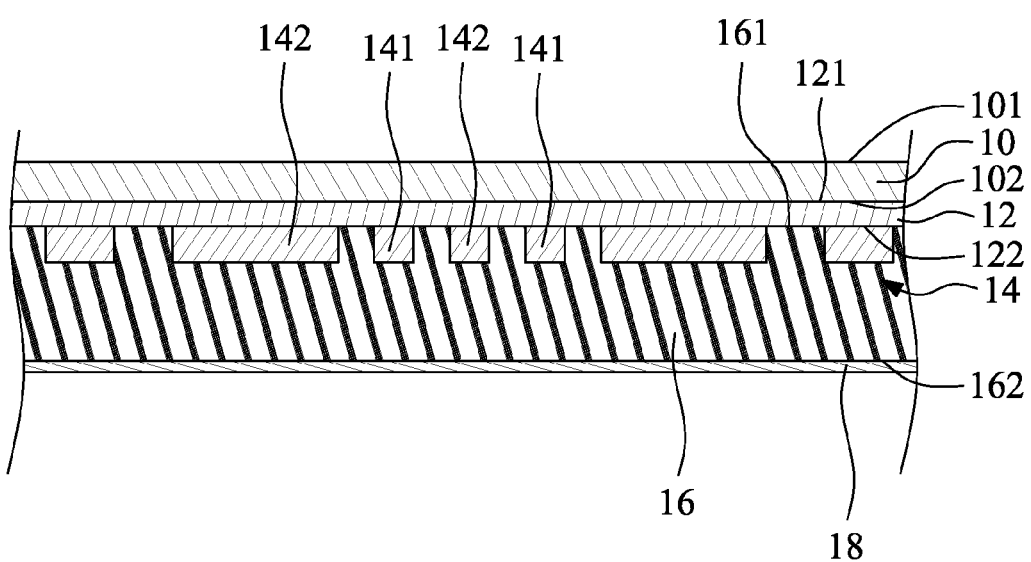

Referring to FIG. 4, the insulation layer 16 is formed on the first circuit layer 14 and the first metal layer 12. The insulation layer 16 is made from an insulating material or a dielectric material, for example, PP, which is attached to the first circuit layer 14 and the first metal layer 12 by using a pressing technology. After the pressing, the insulation layer 16 has a first surface 161 and a second surface 162, wherein the first surface 161 of the insulation layer 16 contacts the second surface 122 of the first metal layer 12, and the first circuit layer 14 is embedded in the first surface 161 of the insulation layer 16. Next, a second metal layer 18 is formed on the second surface 162 of the insulation layer 16. The second metal layer 18 may be, for example, a copper foil, which is pressed on or adhered to the second surface 162 of the insulation layer 16.

Figure 5:
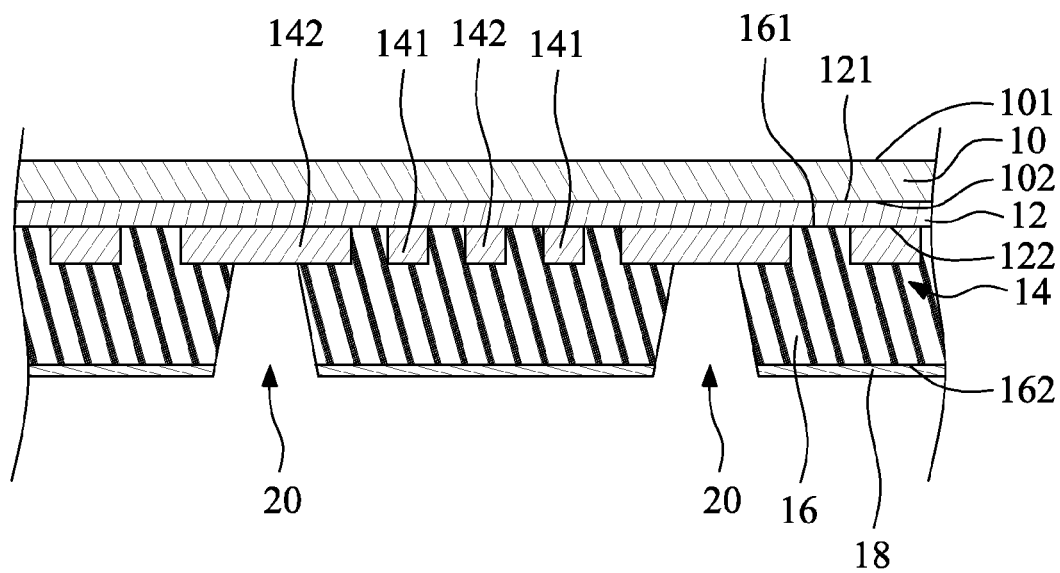
Figure 6:
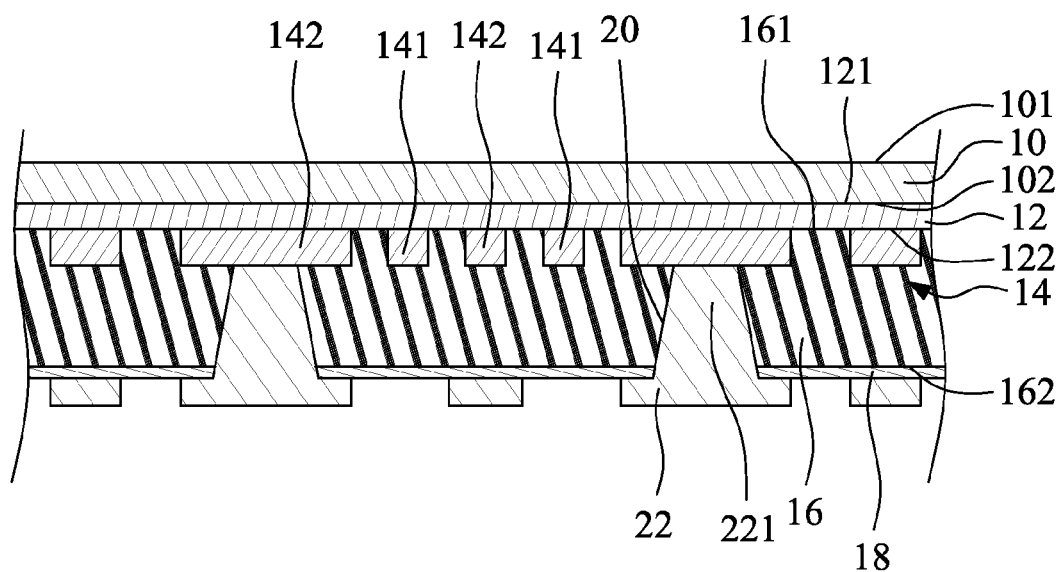

Referring to FIG. 5, a plurality of through holes 20 are formed to penetrate through the second metal layer 18 and the insulation layer 16, so as to expose part of the first circuit layer 14. For example, the through holes 20 are formed through laser drilling Referring to FIG. 6, the through holes 20 are filled with a metal to form the conductive vias 221, and the third metal layer 22 is formed as a patterned metal layer on the second metal layer 18 and on the conductive vias 221. The third metal layer 22 and the conductive vias 221 may be formed during the same process step. Therefore, the conductive vias 221 penetrate though the insulation layer 16 and the second metal layer 18 and contact the first circuit layer 14. Meanwhile, the third metal layer 22 covers one part of the second metal layer 18 and exposes the other part of the second metal layer 18. In this embodiment, the third metal 22 may be electroplated copper, formed in a manner of electroplating.

Figure 7:
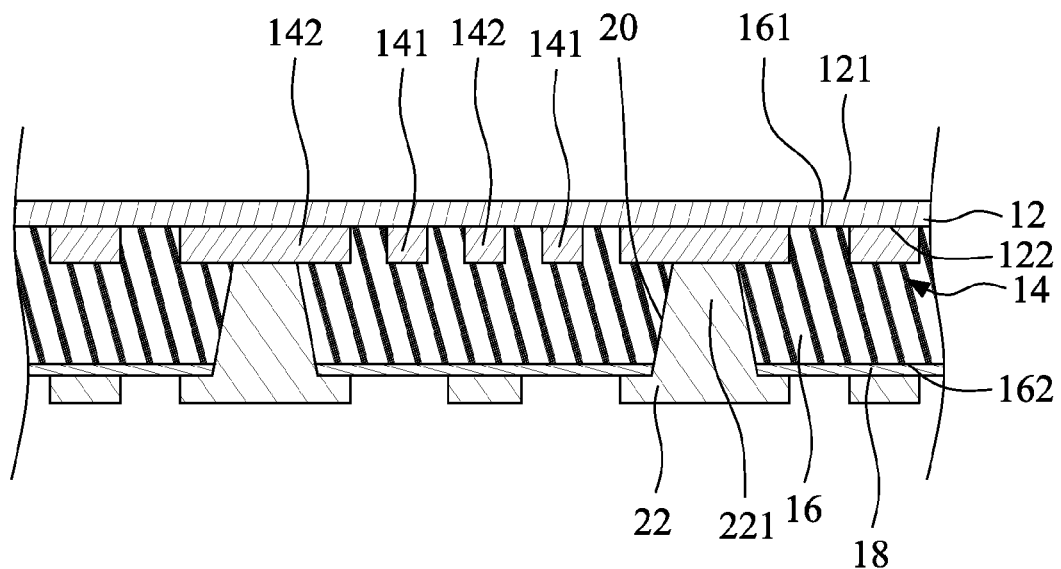

Referring to FIG. 7, the carrier 10 is removed, for example by stripping, to expose the first metal layer 12. At this time, the first metal layer 12, the insulation layer 16, the first circuit layer 14, the conductive vias 221, the second metal layer 18 and the third metal layer 22 form an embedded circuit substrate.

Figure 8:
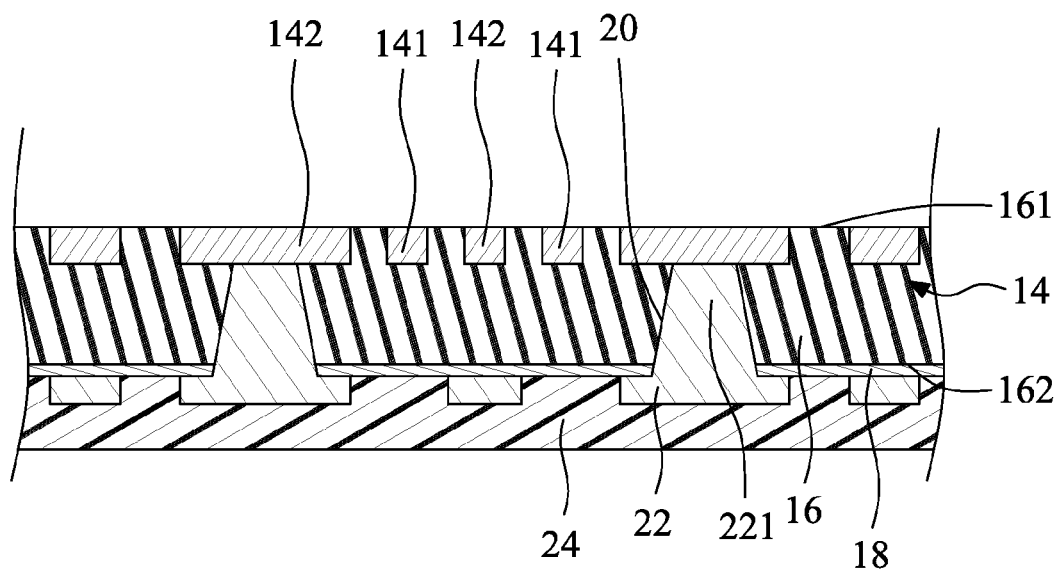

Referring to FIG. 8, a first photoresist layer 24 is formed and metal layer 12 is removed. The first photoresist layer 24 is formed adjacent to the insulation layer 16, wherein the position of the first photoresist layer 24 is opposite to that of the first circuit layer 14. In this embodiment, the first photoresist layer 24 may be a dry film, does not have any opening, and completely covers the second metal layer 18 and the third metal layer 22.

Next, the first metal layer 12 is removed, to expose the first circuit layer 14. In this embodiment, the first metal layer 12 is completely removed, for example by etching. At this time, the insulation layer 16 and the first circuit layer 14 are exposed, and the first circuit layer 14 is exposed from the first surface 161 of the insulation layer 16. An exposed surface of the first circuit layer 14 is substantially coplanar with the first surface 161 of the insulation layer 16.

Figure 9:
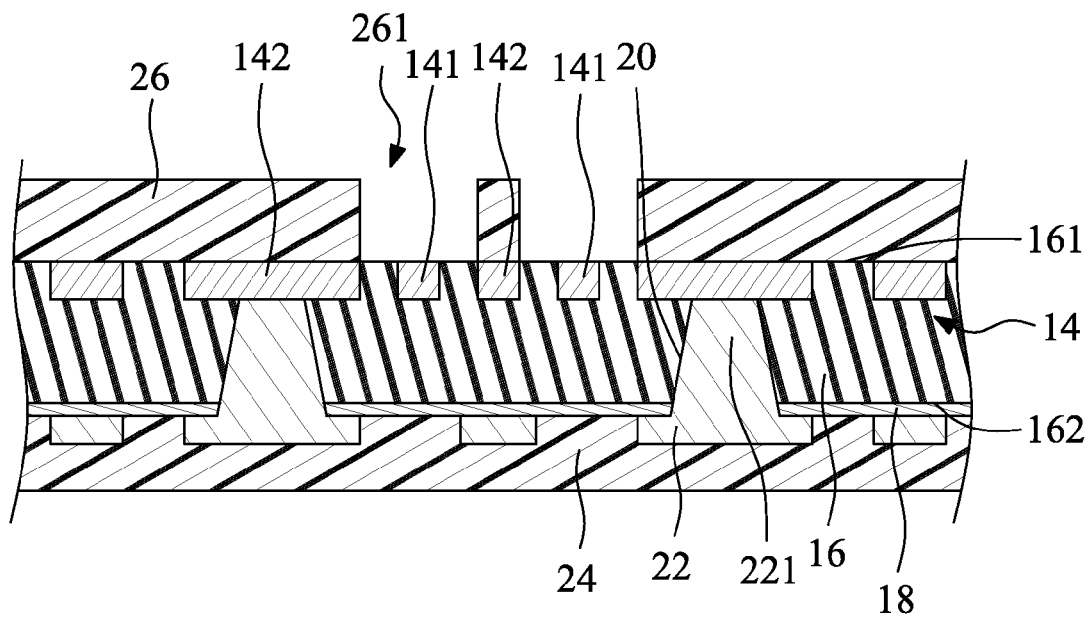

Referring to FIG. 9, a second photoresist layer 26 is formed on the first circuit layer 14 and the first surface 161 of the insulation layer 16. In this embodiment, the second photoresist layer 26 may be a dry film. Next, a plurality of openings 261 are formed in the second photoresist layer 26 to expose part of the first circuit layer 14 and part of the first surface 161 of the insulation layer 16. In this embodiment, the openings 261 expose the pads 141 of the first circuit layer 14 and part of the insulation layer 16, that is, the openings 261 do not expose the traces 142 of the first circuit layer 14.

Figure 10:
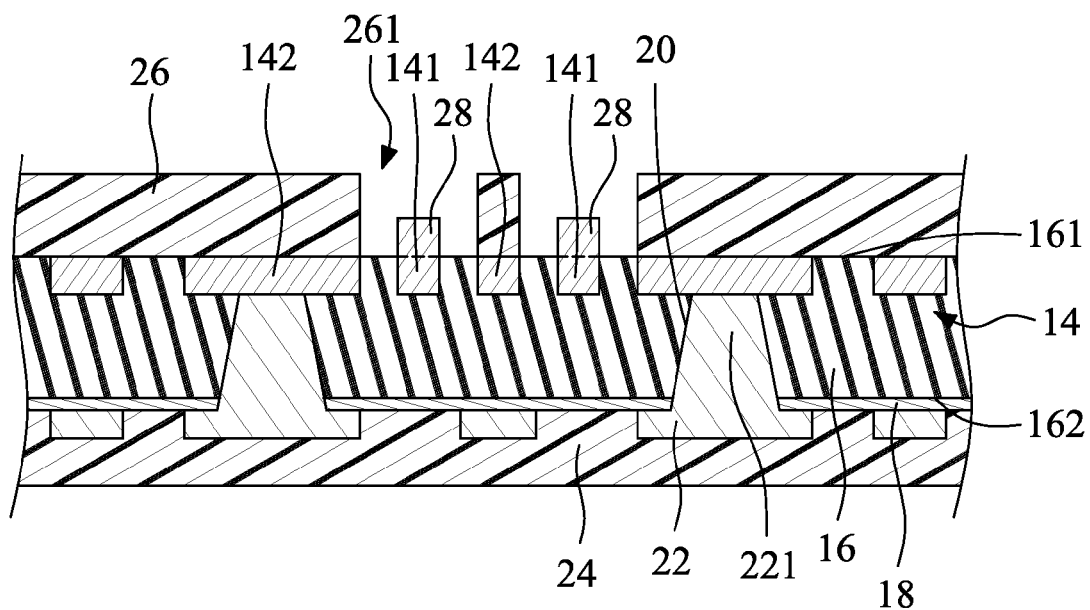

Referring to FIG. 10, a plurality of bumps 28 are directly formed on the first circuit layer 14 (that is, the pads 141). In this embodiment, the bumps 28 may be made from electroplated copper, which are directly formed on the exposed first circuit layer 14 (that is, the pads 141) in a manner of electroplating. Therefore, the lattice of the bumps 28 is the same as that of the first circuit layer 14 (both are electroplated copper). In this embodiment, each of the bumps 28 is located in a range enclosed by an extending upward imaginary plane of an outer sidewall of each of the pads 141. That is, the bumps 28 are located right on the pads 141, and the range enclosed by an outer wall of the bump 28 is equal to or slightly less than that enclosed by the outer wall of the pad 141. The bumps 28 and the pads 141 do not have the problem of offset therebetween, and the bumps 28 may not cover or contact the first surface 161 of the insulation layer 16.

It should be noted that, as the pads 141 and the traces 142 of the first circuit layer 14 are electrically connected to the second metal layer 18 by using the conductive vias 221, the above-mentioned electroplating operation electroplates the pads 141 by electrifying the second metal layer 18.

Figure 11:
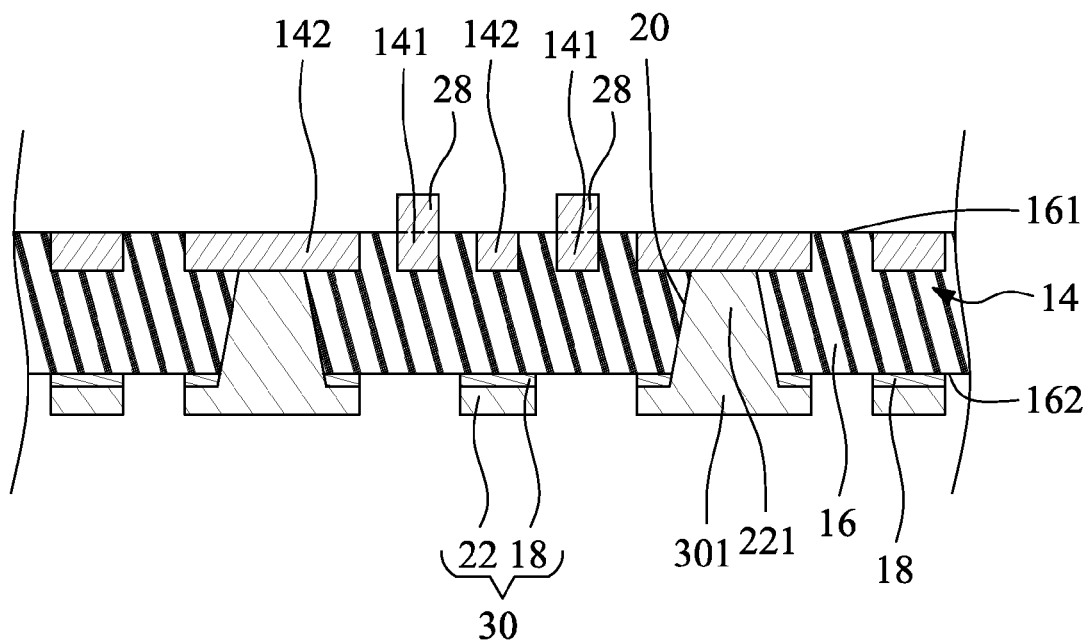

Referring to FIG. 11, the first photoresist layer 24 and the second photoresist layer 26 are removed. Next, the second metal layer 18 not covered by the third metal layer 22 is removed, for example by etching, to form the second circuit layer 30, wherein the second circuit layer 30 includes a plurality of solder ball pads 301. In this embodiment, the second circuit layer 30, which includes, or consists of, the second metal layer 18 and the third metal layer 22, is not embedded in the second surface 162 of the insulation layer 16, and is a patterned conductive circuit layer.

Next, referring to FIG. 11 and also referring back to FIG. 1, the first protection layer 32 is formed on the first surface 161 of the insulation layer 16 and the first circuit layer 14, and the second protection layer 34 is formed on the second surface 162 of the insulation layer 16 and the second circuit layer 30, to obtain the semiconductor substrate 1 as shown in FIG. 1. The first protection layer 32 has at least one opening 321, to expose part of the first surface 161 of the insulation layer 16, part of the first circuit layer 14 and the bumps 28. The second protection layer 34 has at least one opening 341, to expose part of the second circuit layer 30 (that is, the solder ball pads 301), for the solder balls to connect.

According to the above-mentioned manufacturing method of the semiconductor substrate 1, in the step wherein the second photoresist layer 26 forms openings 261 (see FIG. 9) to expose part of the first circuit layer 14, in order to prevent the second photoresist layer 26 from covering the pads 141 and to prevent the openings 261 of the second photoresist layer 26 from exposing the traces 142, a minimum value of a width 'R' of an opening 261 of the second photoresist layer 26 is a width 'W' of the pad 141, and a maximum value of the width 'R' of the opening 261 is a sum of the width 'W' of the pad 141 and twice a distance 'D' between the pad 141 and the nearest pad 141 or trace 142. Therefore, the width 'R' of the opening 261 is designed according to the following formula:

$$W \leq R \leq W+(2 \times D).$$

In addition, if considering that a tolerance from machine, for example, a photolithography equipment, may result in that there is a slight offset between the position of the ultimate opening and the expected opening position, in order to prevent the second photoresist layer 26 from covering most of the pads 141 to affect a growing size of the bumps 28, and to prevent the openings 261 of the second photoresist layer 26 from exposing the traces 142 to grow the bumps 28, the width of the openings of the second photoresist layer 26 may be described by a range including a tolerance value, described as follows.

Figure 12A:
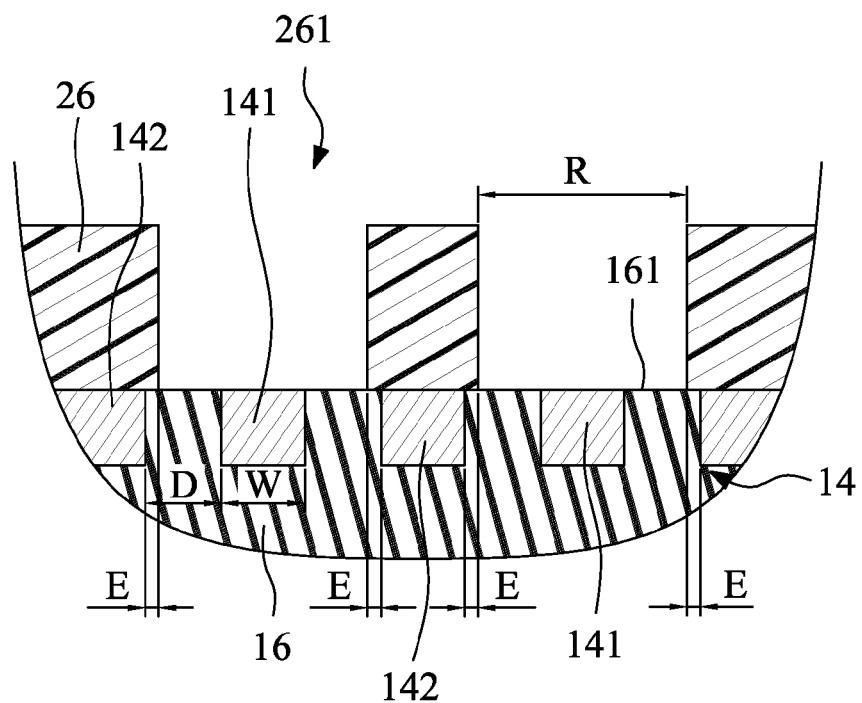
FIG. 12a is an example of the second photoresist layer.
Figure 12B:
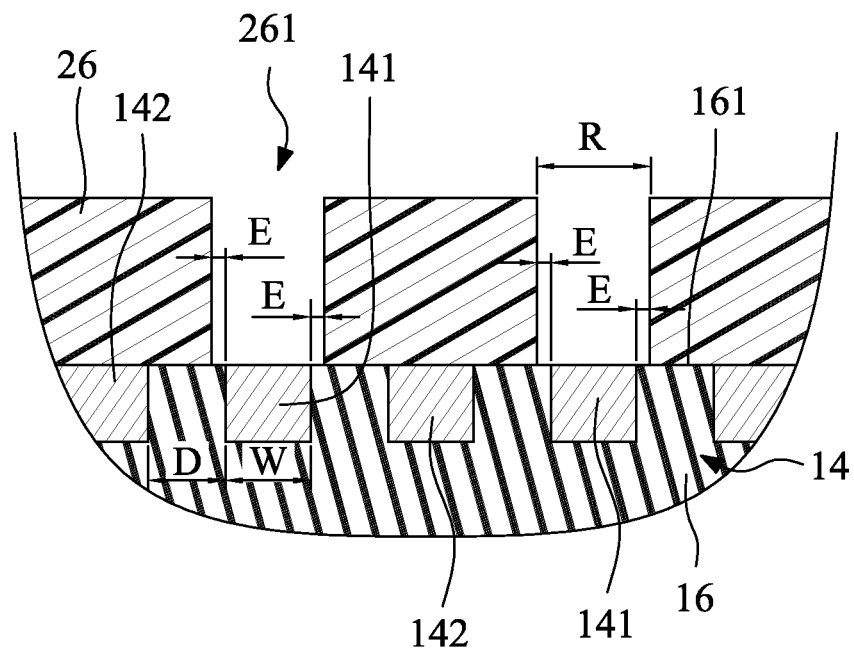
FIG. 12b is another example of the second photoresist layer.

Referring to FIG. 12a and FIG. 12b, in these embodiments, the pads 141 are not covered by the second photoresist layer 26, and thus during electroplating of the bumps 28, the bumps 28 may completely extend upwards from the pads 141 to grow up. This embodiment uses a machine (e.g., a photolithography equipment, not shown) to form the openings 261 in the second photoresist layer 26, and the machine has a tolerance value 'E'. As shown in FIG. 12b, in consideration of the tolerance value 'E', the openings 261 may offset towards a first direction (the right side in FIG. 12b) from the expected position or a second direction (the left side in FIG. 12b) opposite the first direction from the expected position; therefore, in order to ensure that the second photoresist layer 26 may not cover the pads 141 to affect subsequent growing of the bumps 28, the minimum value of the width 'R' of the openings 261 of the second photoresist layer 26 is a sum of the width 'W' of the pads 141 and twice the tolerance value 'E', wherein the twice the tolerance value 'E' is used to compensate for possible offset when the openings 261 of the second photoresist layer 26 are formed. In addition, as shown in FIG. 12a, in order to prevent the second photoresist layer 26 from exposing the traces 142 to grow the bumps 28, the maximum value (upper limit) of the width 'R' of the opening 261 of the second photoresist layer 26 is: (the width 'W' of the pads 141)+(twice the distance 'D' between the pad 141 and the nearest pad 141 or trace 142)−(twice the tolerance value 'E'), wherein the twice the tolerance value 'E' is used to compensate for possible offset when the openings 261 of the second photoresist layer 26 are formed to expose the traces 142. Therefore, the width 'R' of the openings 261 is designed according to the following formula:

$$W+(2 \times E) \leq R \leq W+(2 \times D)-(2 \times E).$$

Figure 13:
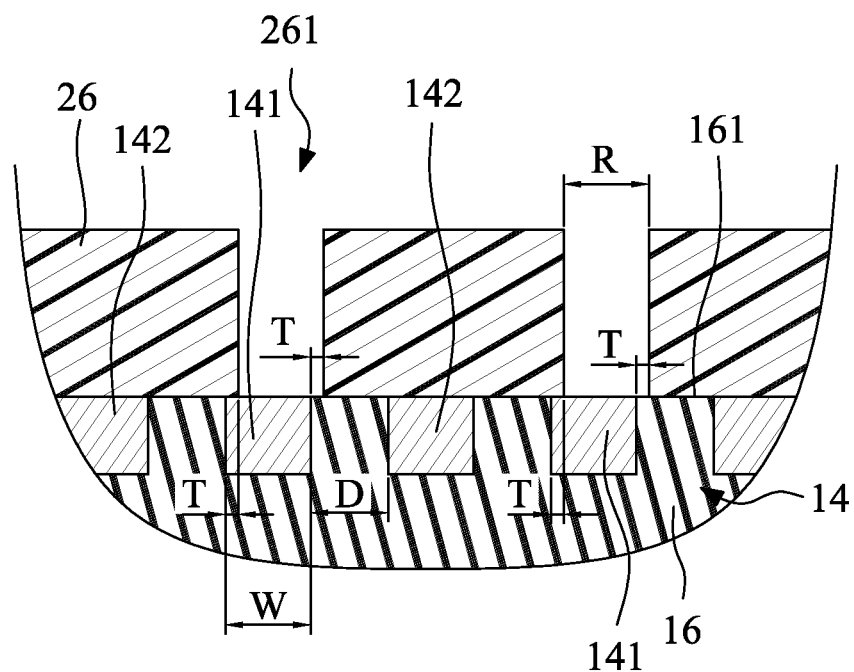
FIG. 13 is another example of the second photoresist layer.

Referring to FIG. 13, in this embodiment, the second photoresist layer 26 covers part of the pads 141, and thus during electroplating of the bumps 28, the bumps 28 will not be grown in areas covered by the second photoresist layer 26. In order to ensure a growing size of the bumps 28, the maximum permissible value of the portion of the pads 141 covered by the second photoresist layer 26 is 'T', and design of the width 'R' of the opening 261 may be divided into the following two situations.

The first situation is as follows, when the tolerance value 'E' is less than the maximum permissible value 'T', the minimum value (lower limit) of the width 'R' of the opening 261 is the width 'W' of the pad 141. At this time, although the second photoresist layer 26 may cover part of the pads 141 due to the tolerance, this is acceptable (because the tolerance value 'E' is less than the maximum permissible value 'T'). In addition, in order to prevent the second photoresist layer 26 from exposing the traces 142 to grow the bumps 28, the maximum value of the width 'R' of the opening 261 is also as shown in FIG. 12a. Therefore, this situation is represented with the following formula:

$$W \leq R \leq W+(2 \times D)-(2 \times E).$$

The second situation is as follows, when the tolerance value 'E' is greater than the maximum permissible value 'T', at this time, the minimum value (lower limit) of the width 'R' of the opening 261 must be greater than the minimum value of the width 'R' of the opening 261 in the first situation, to prevent the portion of the pad 141 covered by the second photoresist layer 26 from exceeding the maximum permissible value 'T' due to the tolerance. Therefore, the minimum value (lower limit) of the width 'R' of the opening 261 is: (the width 'W' of the pad 141)+twice (the tolerance value 'E' minus the maximum permissible value 'T'). In addition, in order to prevent the second photoresist layer 26 from exposing the traces 142 to grow the bumps 28, the maximum value of the width 'R' of the opening 261 is also as shown in FIG. 12a. Therefore, this situation is represented with the following formula:

$$W+2\times(E-T)\leq R\leq W+(2\times D)-(2\times E),$$

wherein E>T. A value 'P' is defined as: (the maximum permissible value 'T')/(the width 'W' of the pad 141), and T=W× P. For example, when the width 'W' of the pad 141 is about 20 μm to 25 μm, the maximum permissible value 'T' thereof is about 5 μm to 8 μm, that is, the larger the width of the pad, the greater the maximum permissible value 'T'. In this example, 'P' is in the range of 5/20 to 8/25, that is, 0.25 to 0.32. One of ordinary skill in the art would understand that for smaller or larger widths 'W' of pad 141, the maximum permissible value 'T' may be correspondingly smaller or larger, and the ratio 'P' may be therefore be in a different range.

Figure 14:
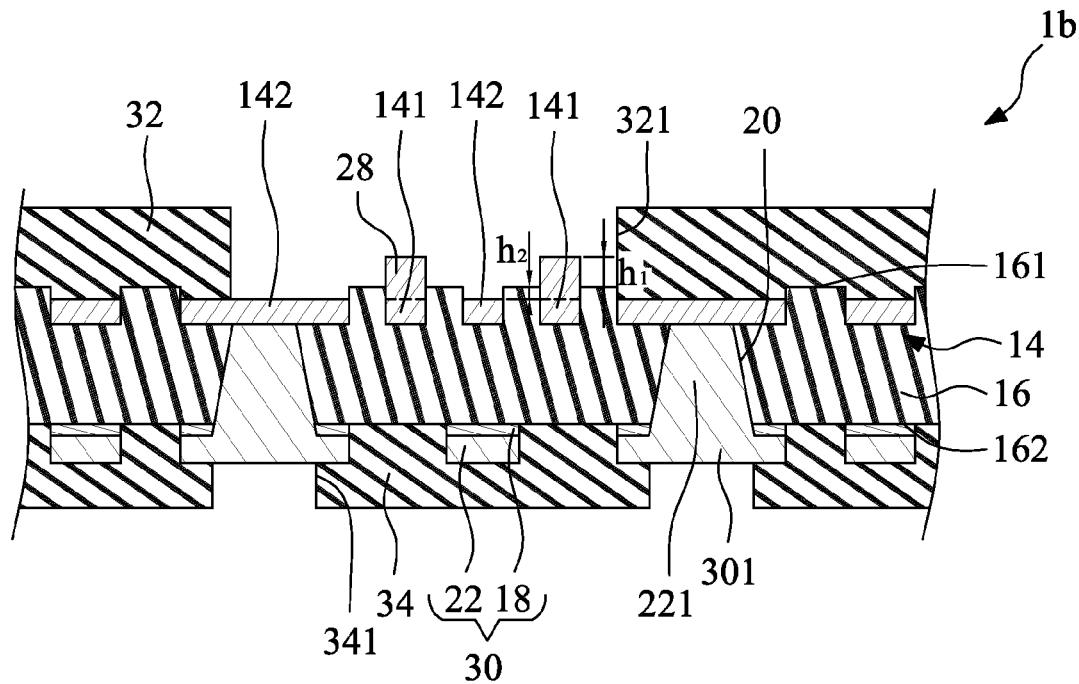
FIG. 14 is a schematic partial cross-sectional view of another embodiment of a semiconductor substrate according to the present disclosure.

FIG. 14 is a schematic partial cross-sectional view of another embodiment of a semiconductor substrate according to the present disclosure. The semiconductor substrate 1b in this embodiment is similar to the semiconductor substrate 1 shown in FIG. 1, and differences are described as follows. In the semiconductor substrate 1b of this embodiment, the exposed surface of the first circuit layer 14 (that is, the top surface of the traces 142) is not coplanar with the exposed surface of the insulation layer 16 (that is, the first surface 161 of the insulation layer 16). As shown in FIG. 14, the horizontal position of the exposed surface of the first circuit layer 14 (that is, the top surface of the traces 142) is slightly lower than that of the exposed surface of the insulation layer 16 (that is, the first surface 161 of the insulation layer 16), wherein a height $h_2$ between the exposed surface of the first circuit layer 14 and the first surface 161 of the insulation layer 16 is, for example, 5±3 μm. In this embodiment, the bumps 28 extend upwards from the exposed surface of the first circuit layer 14, and a height difference $h_1$ between the top surface of the bumps 28 and the first surface 161 of the insulation layer 16 is, for example, 18±8 μm. In other embodiments, the height difference $h_1$ may be less or more, and the tolerance may be less or more; for example, height difference $h_1$ may be 15-25 μm with a tolerance of ±7, ±6, ±5, or ±4 μm. Because bumps of a flip chip contact the bumps 28 extended above the first surface 161 of the insulation layer 16, the situation in which voids occur during bottom underfill between bumps of a flip chip and contact points on substrate 1b may be avoided. Therefore, when the semiconductor substrate 1b and a flip chip (not shown) are bonded, bumps of the flip chip may directly contact the bumps 28 of the semiconductor substrate 1b, so that the situation that the bumps of the flip chip cannot contact the first circuit layer 14 recessed from the insulation layer 16 can be avoided.

Figure 15:
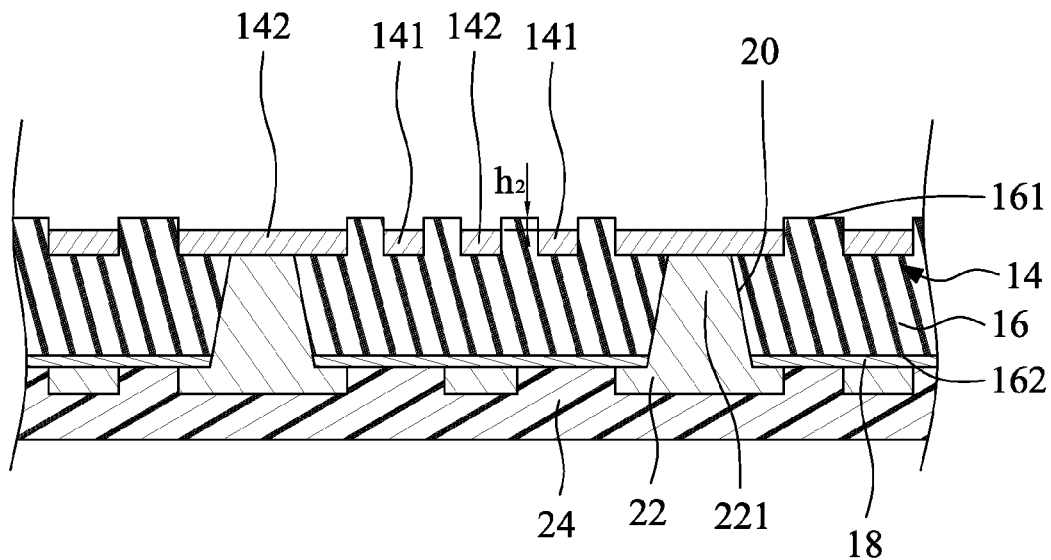
FIG. 15 to FIG. 16 are schematic views of another embodiment of a manufacturing method of a semiconductor substrate according to the present disclosure.
Figure 16:
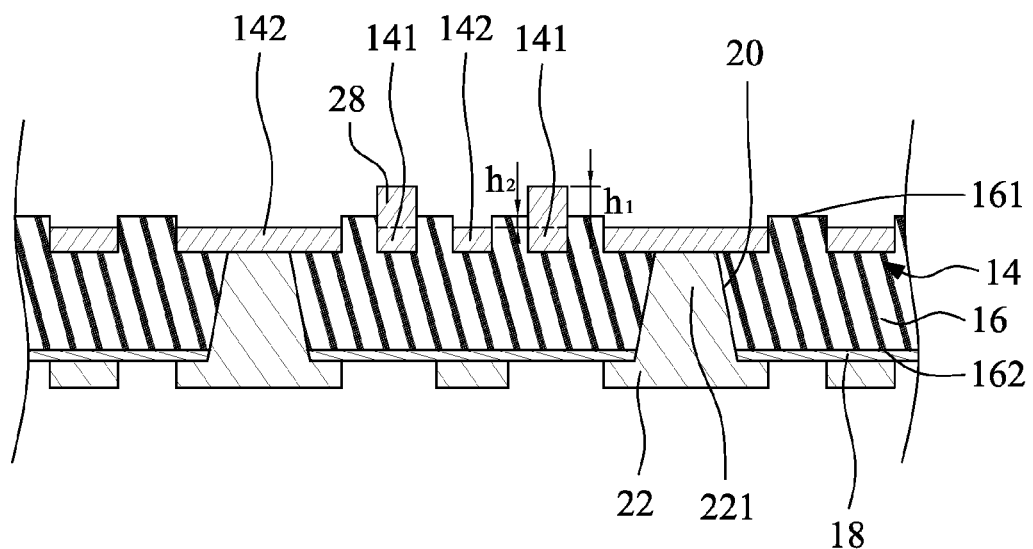

FIG. 15 and FIG. 16 are schematic views of another embodiment of a manufacturing method of a semiconductor substrate according to the present disclosure, for manufacturing the substrate 1b of FIG. 14. In this embodiment, the "initial" process is the same as that in the manufacturing method described by FIG. 2 to FIG. 7. The manufacturing method in the embodiment described by FIG. 15 and FIG. 16 is subsequent to the steps in FIG. 7.

Referring to FIG. 15, a first photoresist layer 24 is formed and the first metal layer 12 is removed. The first photoresist layer 24 is formed adjacent to the insulation layer 16, where the position of the first photoresist layer 24 is opposite to that of the first circuit layer 14. Next, the first metal layer 12 is completely removed, for example by etching, to expose the first circuit layer 14 and the first surface 161 of the insulation layer 16. In this embodiment, the top of the first circuit layer 14 is also etched, that is, over-etched, so that the exposed surface of the first circuit layer 14 (that is, the top surface after the pads 141 and the traces 142 are etched) is not coplanar with the exposed surface of the insulation layer 16 (that is, the first surface 161 of the insulation layer 16). As shown in FIG. 15, the horizontal position of the exposed surface of the first circuit layer 14 (that is, the top surface after the pads 141 and the traces 142 are etched) is slightly lower than that of the exposed surface of the insulation layer 16 (that is, the first surface 161 of the insulation layer 16), to form a plurality of notch structures. In this embodiment, a height difference $h_2$ between the top surface of the pads 141 and the traces 142 and the first surface 161 of the insulation layer 16 is 5±3 μm. In other embodiments, the height difference $h_2$ may be less or more, and the tolerance may be less or more; for example, height difference $h_2$ may be 10-20 μm with a tolerance of ±3, ±2, or ±1 μm.

Referring to FIG. 16, the bumps 28 are formed on the exposed first circuit layer 14 (that is, the pads 141). The manner in which the bumps 28 are formed is the same as that in FIG. 9 to FIG. 10, which is described as follows. First (as described with respect to FIG. 9), a second photoresist layer 26 is formed on the first circuit layer 14 and the first surface 161 of the insulation layer 16. Next, a plurality of openings 261 are formed on the second photoresist layer 26 to expose part of the first circuit layer 14 and part of the first surface 161 of the insulation layer 16. Then (as described with respect to FIG. 10), the bumps 28 are directly formed on the exposed first circuit layer 14 (that is, the pads 141). In this embodiment, a height difference $h_1$ between the top surface of the bumps 28 and the first surface 161 of the insulation layer 16 is 18±8 μm. Next, using a similar process to that shown in FIG. 11, after the first photoresist layer 24 and the second photoresist layer 26 are removed, the second metal layer 18 not covered by the third metal layer 22 is removed, for example by etching, to form the second circuit layer 30. Then, the first protection layer 32 is formed on the first surface 161 of the insulation layer 16 and the first circuit layer 14, and the second protection layer 34 is formed on the second surface 162 of the insulation layer 16 and the second circuit layer 30, to obtain the semiconductor substrate 1b as shown in FIG. 14.

Figure 17:
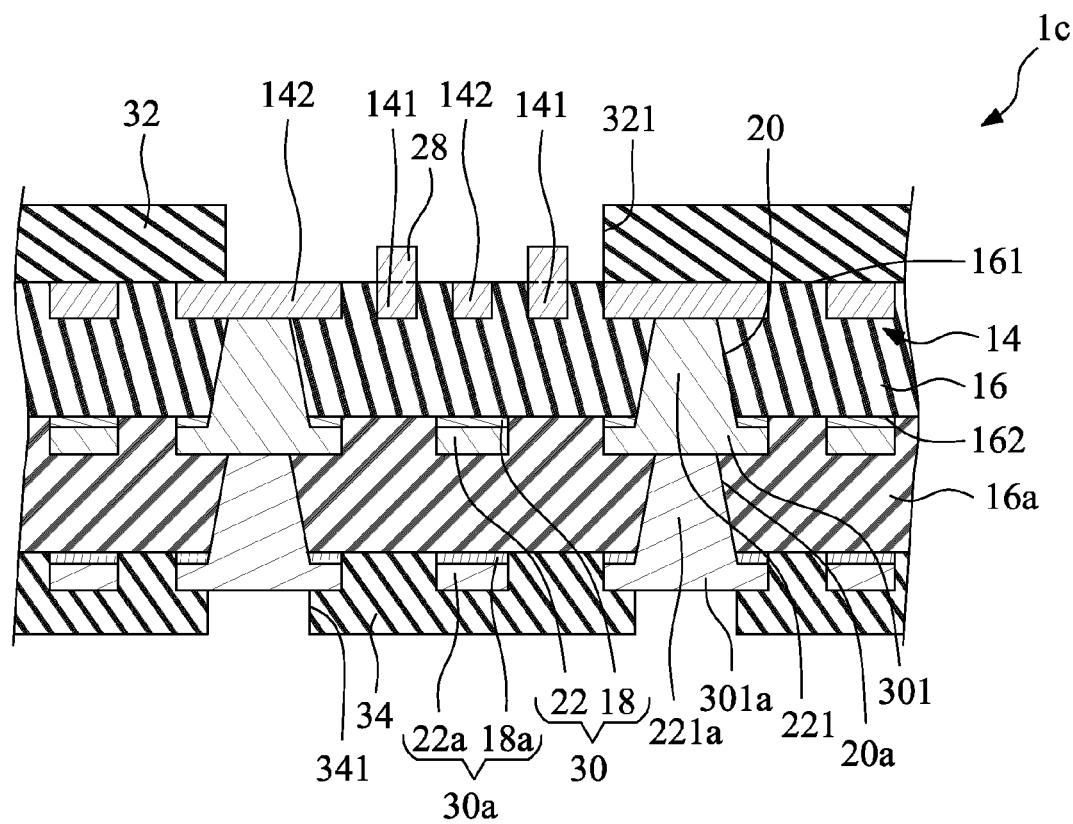
FIG. 17 is a schematic partial cross-sectional view of another embodiment of a semiconductor substrate according to the present disclosure.

FIG. 17 is a schematic partial cross-sectional view of another embodiment of a semiconductor substrate according to the present disclosure. The semiconductor substrate 1c in this embodiment is similar to the semiconductor substrate 1 shown in FIG. 1, and differences are described as follows. In this embodiment, the semiconductor substrate 1c further includes a stacked insulation layer 16a, a third circuit layer 30a and a plurality of lower conductive vias 221a. The stacked insulation layer 16a is located on the second circuit layer 30 and the insulation layer 16, and has a plurality of through holes 20a. The second circuit layer 30 is embedded in the stacked insulation layer 16a. The third circuit layer 30a is located on the bottom of the stacked insulation layer 16a. In this embodiment, the third circuit layer 30a is not embedded in the stacked insulation layer 16a. The third circuit layer 30a is a patterned conductive circuit layer, including, or consisting of, a fourth metal layer 18a and a fifth metal layer 22a. The fourth metal layer 18a is located on the bottom of the stacked insulation layer 16a, and the fifth metal layer 22a is located on the fourth metal layer 18a. The fourth metal layer 18a is similar to the second metal layer 18; for example, both are formed by etching a copper foil; the fifth metal layer 22a is similar to the third metal layer 22; for example, both are electroplated copper, formed through an electroplating process. The third circuit layer 30a includes a plurality of solder ball pads 301a.

The lower conductive vias 221a are located in the through holes 20a, and thus penetrate through the stacked insulation layer 16a and are electrically connected to the second circuit layer 30 and the third circuit layer 30a. The second protection layer 34 is located on the bottom of the stacked insulation layer 16a and the third circuit layer 30a, and has at least one opening 341, to expose part of the third circuit layer 30a (that is, the solder ball pads 301a), for the solder balls to connect. It should be understood that, in other embodiments, more insulation layers and circuit layers may be further formed below the stacked insulation layer 16a and the third circuit layer 30a.

Figure 18:
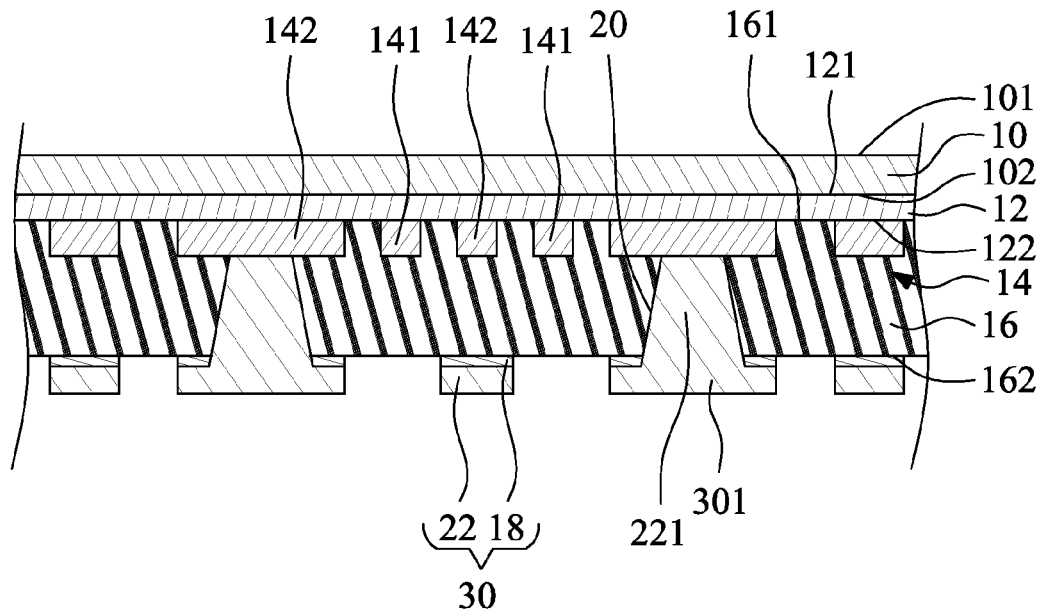
FIG. 18 to FIG. 19 are schematic views of another embodiment of a manufacturing method of a semiconductor substrate according to the present disclosure.
Figure 19:
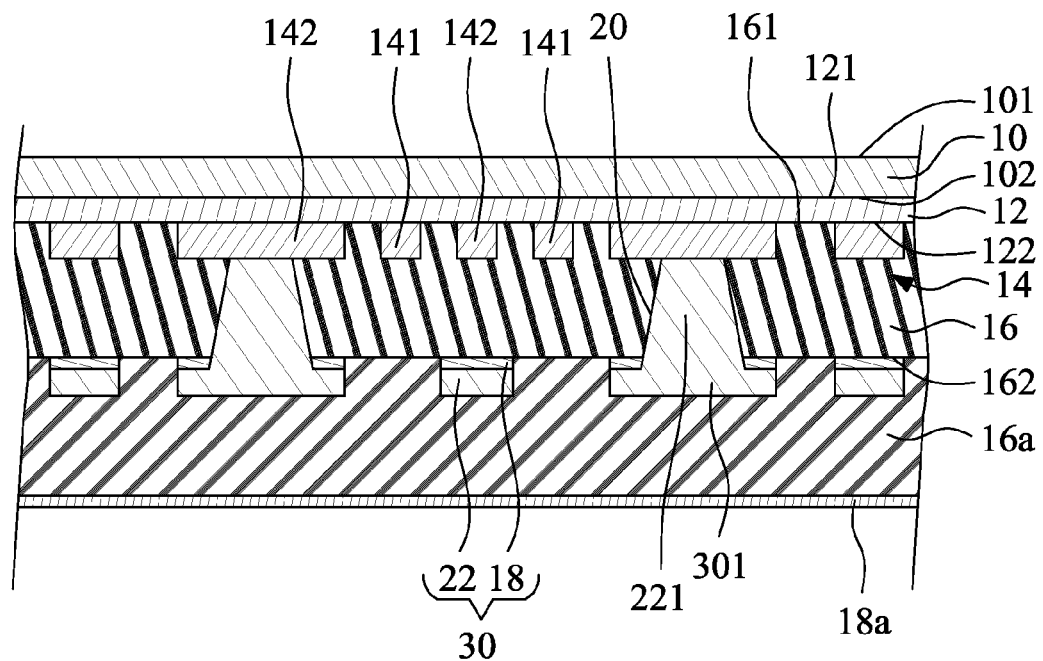

FIG. 18 to FIG. 19 are schematic views of another embodiment of a manufacturing method of a semiconductor substrate according to the present disclosure, to manufacture the substrate 1c of FIG. 17. In this embodiment, the "initial" process is the same as that in the manufacturing method in FIG. 2 to FIG. 7. The manufacturing method in this embodiment is subsequent to the steps in FIG. 7.

Referring to FIG. 18, the second metal layer 18 not covered by the third metal layer 22 is removed in a manner of etching, to form the second circuit layer 30.

Referring to FIG. 19, a stacked insulation layer 16a is formed on the insulation layer 16 and the second circuit layer 30, so that the second circuit layer 30 is embedded in the stacked insulation layer 16a. The material of the stacked insulation layer 16a is the same as or different from that of the insulation layer 16. Next, the fourth metal layer 18a is formed on the bottom of the stacked insulation layer 16a. In this embodiment, the fourth metal layer 18a is the same as the second metal layer 18, both of which may be a copper foil, pressed on or adhered to the stacked insulation layer 16a.

Next (referring to FIG. 17), a plurality of through holes 20a are formed to penetrate through the fourth metal layer 18a and the stacked insulation layer 16a. Next, the through holes 20a are filled with the fifth metal layer 22a to form the lower conductive vias 221a. Next, the third circuit layer 30a is formed.

Next, the steps in FIG. 8 to FIG. 11 are performed, to form the bumps 28, the third circuit layer 30a, the first protection layer 32 and the second protection layer 34, so as to obtain the semiconductor substrate 1c in FIG. 17. It should be understood that, in other embodiments, the steps in FIG. 18 to FIG. 19 may be repeated, to form more insulation layers and circuit layers.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, subdivided, or re-ordered to form an equivalent method without departing from the teachings of the present disclosure. Accordingly, unless specifically indicated herein, the order and grouping of the operations are not limitations of the present disclosure.

What is claimed is:

1. A manufacturing method of a semiconductor substrate, comprising:
provin an embedded circuit substrate, the embedded circuit substrate comprising an insulation layer, a first circuit layer and a plurality of conductive vias, wherein the insulation layer has a first surface and a second surface, the first circuit layer is embedded in the first surface of the insulation layer, and exposed from the first surface of the insulation layer, and the conductive vias penetrate through the insulation layer and contact the first circuit layer;
forming a photoresist layer on the first circuit layer, wherein the photoresist layer has a plurality of openings, and the openings expose part of the first circuit layer; and
forming a plurality of bumps directly on the exposed first circuit layer.

2. The manufacturing method according to claim 1, wherein the embedded circuit substrate further comprises a first metal layer, a second metal layer and a patterned metal layer, wherein the first metal layer is located on the first circuit layer and the first surface of the insulation layer, the second metal layer is located on the second surface of the insulation layer, and the patterned metal layer is located on the second metal layer, wherein the conductive vias are electrically connected to the first circuit layer, the second metal layer and the patterned metal layer.

3. The manufacturing method according to claim 2, wherein after providing the embedded circuit substrate, the method further comprises removing the first metal layer to expose the first circuit layer and the insulation layer.

4. The manufacturing method according to claim 2, wherein after forming the bumps, the method further comprises removing the second metal layer not covered by the patterned metal layer, to form a second circuit layer.

5. The manufacturing method according to claim 2, wherein providing the embedded circuit substrate comprises providing a carrier having the first metal layer, wherein the first metal layer is a copper foil, pressed on the carrier.

6. The manufacturing method according to claim 1, wherein the first circuit layer is recessed from the first surface of the insulation layer.

7. The manufacturing method according to claim 1, wherein the first circuit layer comprises a plurality of pads and a plurality of traces, the width of the pads is W, and the distance between the pad and adjacent pad or trace is D; the opening has an opening width R, wherein $W \leq R \leq W+(2 \times D)$.

8. The manufacturing method according to claim 1, wherein the first circuit layer comprises a plurality of pads and a plurality of traces, the width of the pads is W, and the distance between the pad and adjacent pad or trace is D; the openings of the photoresist layer are formed in the photoresist layer with a tolerance E, and the opening has an opening width R, wherein $W+(2 \times E) \leq R \leq W+(2 \times D)-(2 \times E)$.

9. The manufacturing method according to claim 1, wherein the first circuit layer comprises a plurality of pads and a plurality of traces, the width of the pads is W, and the distance between the pad and adjacent pad or trace is D; the openings of the photoresist layer are formed in the photoresist layer with a tolerance E, and the opening has an opening width R, part of the pad is covered by the photoresist layer, and a maximum permissible value of the width of the pad covered by the photoresist layer is T, wherein $W+(2 \times E) \leq R \leq W+(2 \times D)-(2 \times E)$, and $E<T$.

10. The manufacturing method according to claim 1, wherein the first circuit layer comprises a plurality of pads and a plurality of traces, the width of the pads is W, and the distance between the pad and adjacent pad or trace is D; the openings of the photoresist layer are formed in the photoresist layer with a tolerance E, and the opening has an opening width R, part of the pad is covered by the photoresist layer, and a maximum permissible value of the width of the pad covered by the photoresist layer is T, wherein $W+2 \times (E-T) \leq R \leq W+(2 \times D)-(2 \times E)$, $E>T$, $T=W \times P$, and P is 0.25 to 0.32.

11. The manufacturing method according to claim 1, wherein after forming the bumps, the method further comprises:
    removing the photoresist layer to expose a plurality of traces of the first circuit layer; and
    forming a protection layer to cover the plurality of traces, wherein the protection layer has at least one opening, and the bumps are located in the at least one opening.

12. The semiconductor substrate according to claim 1, wherein the first circuit layer and the bumps are made from electroplated copper, and the bumps are directly formed on the exposed first circuit layer in a manner of electroplating.

13. A semiconductor substrate, comprising:
    an insulation layer, having a first surface and a second surface;
    a first circuit layer, embedded in the first surface of the insulation layer, and exposed from the first surface of the insulation layer;
    a second circuit layer, located on the second surface of the insulation layer;
    a plurality of conductive vias, penetrating through the insulation layer and electrically connected to the first circuit layer and the second circuit layer; and
    a plurality of bumps, directly located on part of the first circuit layer, wherein a lattice of the bumps is the same as that of the first circuit layer.

14. The semiconductor substrate according to claim 13, wherein the first circuit layer and the bumps are made from electroplated copper.

15. The semiconductor substrate according to claim 13, wherein the first circuit layer is recessed from the first surface of the insulation layer.

16. The semiconductor substrate according to claim 15, wherein a height difference between the first circuit layer and the first surface of the insulation layer is $5 \pm 3$ μm.

17. The semiconductor substrate according to claim 13, wherein the first circuit layer comprises a plurality of pads and a plurality of traces, the bumps are located on the pads, wherein the distance between the pad and adjacent pad or trace is less than 25 μm.

18. The semiconductor substrate according to claim 17, wherein each of the bumps is located in a range enclosed by an extending upward imaginary plane of an outer sidewall of each of the pads.

19. The semiconductor substrate according to claim 13, wherein a height difference between the top surface of the bumps and the first surface of the insulation layer is $18 \pm 8$ μm.

20. The semiconductor substrate according to claim 13, further comprising:
    a stacked insulation layer located on the second circuit layer;
    a third circuit layer located on the stacked insulation layer; and
    a plurality of lower conductive vias penetrating through the stacked insulation layer and electrically connected to the second circuit layer and the third circuit layer.

* * * * *